Oct. 25, 1960 D. E. KAMMER 2,957,979
TRANSISTORIZED STABLE OSCILLATOR-MIXER SYSTEM
Filed Feb. 20, 1958
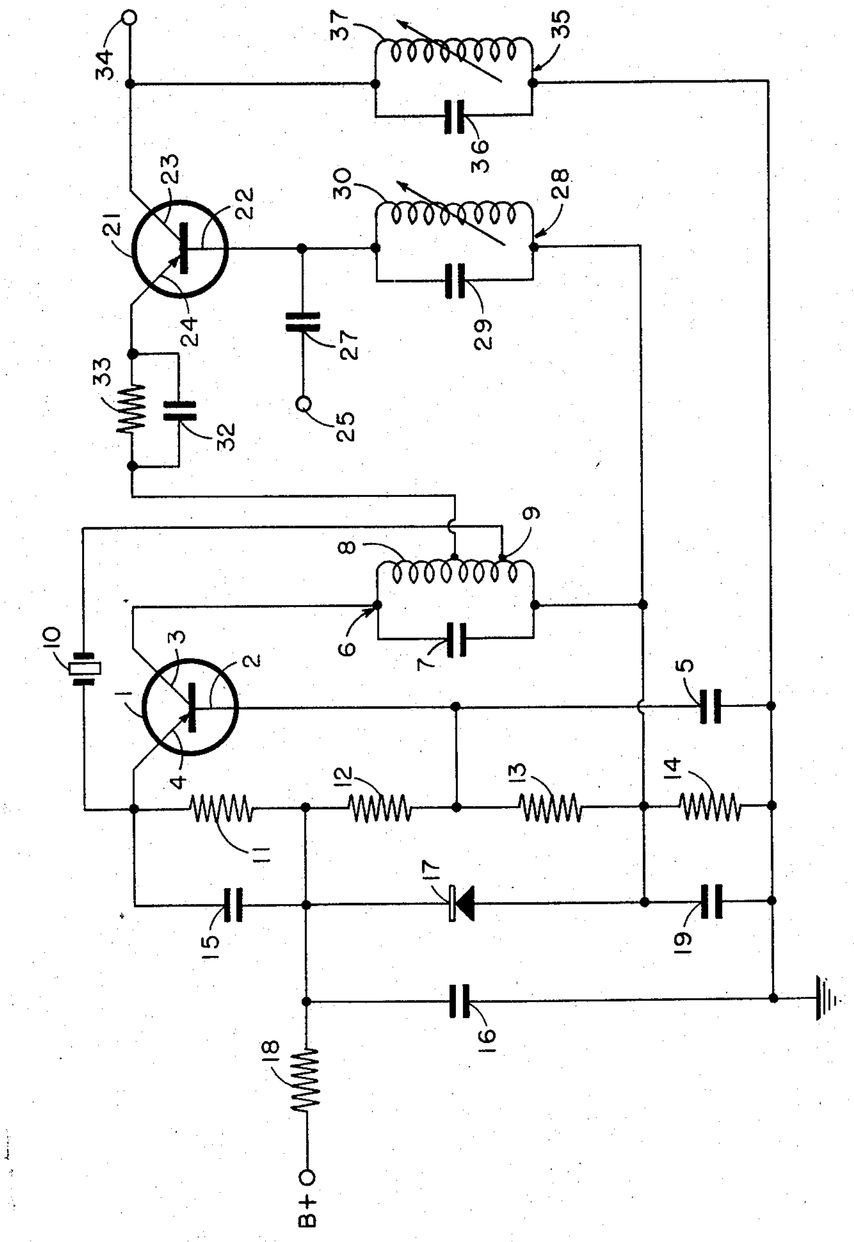
INVENTOR.
DONALD E. KAMMER.
BY Alden D. Redfield
Irwin P. Garfinkle
ATTORNEYS.

2,957,979
Patented Oct. 25, 1960

2,957,979

TRANSISTORIZED STABLE OSCILLATOR-MIXER SYSTEM

Donald E. Kammer, Cincinnati, Ohio, assignor to Avco Manufacturing Corporation, Cincinnati, Ohio, a corporation of Delaware Filed Feb. 20, 1958, Ser. No. 716,369

3 Claims. (Cl. 250—20)

This invention relates generally to a transistorized oscillator-mixer system and, more particularly, to an oscillator-mixer combination which is self-regulating for fixed frequencies and conversion power gain.

In the receiver art, and particularly in superheterodyne receiver art, it is necessary to convert a received radio frequency signal to an intermediate frequency signal. For this purpose an oscillator is provided for generating a difference frequency which is combined with the radio frequency signal in a mixer. By means of this invention I provide a combination of an oscillator and mixer which produces a stable frequency output and a constant power gain.

Common practice imposes a heavy load on the oscillator tank circuit during conduction to satisfy the power equation:

$$\text{Tank circuit efficiency} = 1 - \frac{Q\ (\text{loaded})}{Q\ (\text{unloaded})}$$

As is well known, heavy loading of the tank circuit degrades the inherent frequency stability of an oscillator system, but such loading has generally been found necessary for producing sustained oscillations. By means of the present invention, however, I employ circuitry which produces good efficiency, but which imposes a very light load on the tank circuit. To accomplish sustained oscillations, I provide circuit means whereby the tank circuit is used to gate the power supply to a transistor automatically instead of supplying the output power demand directly, thus deriving most of the drive power from the power supply, rather than from the tank circuit. Such operation permits looser coupling of driven circuits to the oscillator tank circuit and results in less Q loading on the oscillator tank circuit. In addition to the increased frequency stability which results from the achieved high operating Q, several other advantageous results are obtained.

Since oscillator driving bias is governed by the gating action of the tank circuit, the extent of bias change is a function of the tank circuit Q at any particular instant. Moreover, since operating Q of the tank circuit is determined by its loading, the oscillator bias will change with changes in load. When the predominant oscillator load is the input circuit of a mixer, variations in the input impedance of the mixer will vary the tank circuit Q and, hence, the oscillator output may be controlled by the mixer input. In the present invention, the magnitude of the radio frequency signals on the mixer input tends to control the demand from the oscillator such that the summation of the two signals results in a substantially constant converter output. Thus, as will be seen, the unique circuitry disclosed, including the very lightly loaded tank circuit and the circuit means for gating the power supply to derive therefrom power normally demanded from the tank circuit serves to maintain a converter output which is regulated in both frequency and amplitude.

A broad object of this invention is to provide a transistorized oscillator-mixer combination which is highly constant with respect to frequency and power conversion gain.

Another object of this invention is to provide a device that decouples the active element of a transistor oscillator from the tank circuit and thus permits a high order of operating Q and frequency stability.

Still another object of this invention is to produce an oscillator-mixer providing automatic gain regulation on the mixer.

Another object of this invention is to provide an oscillator having a gated power supply for reducing the loading on its tank circuit.

For further objects and for a more complete understanding of the nature of this invention, reference should now be made to the single figure of the drawing in which a preferred form of my invention is schematically represented.

The oscillator portion of my invention includes a junction-type PNP transistor 1 connected for alternating currents in the common emitter, grounded base configuration, i.e., the alternating current load of the transistor is connected between the emitter 4 and the collector 3, while the alternating current input is connected between the base 2 and the emitter 4, the base 2 being grounded for alternating currents by means of condenser 5. As in a conventional oscillator, the frequency determining network comprises a tank circuit 6 including a condenser 7 and a variable inductor 8 connected for alternating currents between the collector and base electrodes. The emitter 4 is connected to a tap on the inductor 8 through a resonant piezoelectric crystal 10. The action of the crystal 10 is that of a variable reactance which is frequency-sensitive. As soon as the frequency moves from natural resonance, the impedance of the crystal increases rapidly, tending to shut down transistor operation. Under normal operating conditions, i.e., when operating at the proper frequency, the crystal 10 has little or no effect, since its impedance is very low.

The input circuit to the transistor 1 includes biasing resistors 11, 12, 13 and 14 connected in series between the emitter 4 and ground, the resistor 11 being shunted for alternating currents by means of a condenser 15, and the resistor 13 being shunted for alternating currents by the condenser 5. For a purpose hereinafter to be described, a condenser 16 and a diode 17 are connected across resistors 12 and 13. Preferably, but not necessarily, the diode 17 is of the Zener type and, among other functions, it serves to regulate the direct current supplied across the biasing resistors 12 and 13 from the B+ supply through a supply resistor 18. The condenser 19 provides an alternating current by-pass for the resistor 14.

The mixer used in accordance with my invention includes a junction-type PNP transistor 21 having a base 22, a collector 23 and an emitter 24. As in conventional mixers, means are provided for injecting received radio frequency signals and the output frequencies of the oscillator into the transistor input for mixing, and thus deriving sum and difference frequency components in the output circuit.

Injection of the radio frequency signals is accomplished at the base 22 of transistor 21 by application of the signals at the input terminal 25 through direct current blocking condenser 27, and across the tank circuit 28 including the condenser 29 and the variable inductor 30. Injection of the oscillator frequencies from the tank circuit 6 is accomplished at the emitter 24 by means of the condenser 32 and resistor 33. The instantaneous oscillator power appearing across condenser 32 and resistor 33 is rectified in the base-emitter junction of transistor 21 to provide back self-bias for the mixer 21 and, as will be seen, the back self-bias will have substantially the correct instantaneous values for maintaining a substantially constant converter gain. The mixed frequency output is derived from the output tap 34 from between the collector 23 and ground by means of a resonant tank 35, including a condenser 36 and an inductor 37 tuned to the desired intermediate frequency. Direct current bias for the base-collector electrode is obtained from across the bias resistor 14, and it will be seen that the variations in voltage across resistor 14 will aid in yielding a constant converter output.

As previously noted, the prior art requires that a considerable amount of power be fed back from the output circuit of a transistor oscillator to the input circuit in order to sustain oscillations. By means of my invention, however, I am able to reduce the amount of feedback very considerably, thus reducing the load of the transistor on the tank circuit and permitting a much higher operating Q than usual. A clearer understanding of these results may be had from the following description of the circuit operation.

When the B+ supply is connected, a circuit is completed through the resistors 18, 12, 13 and 14 to ground. As may be noted, the resistors 12 and 13 are in the base-emitter and base-collector circuits of the transistor, respectively, and voltages developed across these resistors cause current to flow in the transistor junctions. That is to say, the voltage on resistor 12 biases the base-emitter junction of the transistor 1 in a forward direction and this, plus the voltages across resistor 13, provides the correct order of bias between the collector and emitter, thus tending to produce surge currents. However, at the instant current flows through the base-emitter junction, the resistor 11 is effectively shunted across the resistor 12, thereby reducing the base-emitter bias. And similarly, at the instant of conduction through the collector-base junction, the tank 6 is shunted across resistor 13 and this bias is also reduced. When the voltage biases developed on resistors 12 and 13 are thus reduced, the transistor is cut off. However, the voltage charge on condenser 16 tends to prolong the voltage across resistors 12 and 13 at an elevated level and, thus, maintains for a longer period conduction in the base-emitter diode. That is to say, because of the small time constants in circuit with the condenser 16, a voltage charge is rapidly developed on the condenser 16 which is equal to the voltages developed on the resistors 12, 13 and 14. When, due to conduction through the transistor 1, the voltage across the resistors 12 and 13 is reduced, the condenser 16 tends to discharge through the resistors 12 and 13, and the condenser 5 tends to discharge through the resistors 13 and 14. This action tends to maintain the voltages across these resistors at the original level and, thus, the duration of the conduction cycle of the transistor is stretched. Thus, it may be seen that the transistor acts as a gate for the connection of the B+ supply to the tank, and this gate is controlled and regulated by the combined effect of the resistors 11—14, and of the condensers 16, 19 and 5, and the diode 17. It will be noted that power is furnished from the B+ supply during the stretched portion of the cycle and, thus during this period, power is not supplied from, but actually supplied to the tank circuit. In other words, the voltage developed in the pulse-stretching circuit increases the conduction angle of the transistor; but it does so by drawing power largely from the B+ supply rather than from the tank circuit.

Since considerable power is supplied from the B+ supply to the transistor input rather than from the tank circuit 6, the tank circuit may be coupled very lightly into the oscillator circuit. Light loading of the tank circuit 6 produces a high operating Q, thus enhancing frequency stability.

The oscillator circuit described, when used in combination with the mixer circuit, also tends to furnish a very stable mixer gain. As is known in the art, the mixer gain will be constant, provided the sum total of injected oscillator frequency and input signal to the mixer are held constant. The oscillator-mixer combination disclosed herein automatically provides a constant mixer gain by simultaneously controlling the emitter and collector voltages.

This may be understood if it is considered that the input impedance of the mixer serves as a load on the tank circuit 6 of the oscillator. If the input signal to the mixer is increased, the input impedance of the mixer falls and loads the oscillator tank. Since the tank circuit 6 has a very high operating Q, the change in mixer loading will tend to reduce the voltage across the tank, and also reduces the over-all tank impedance. This means that the shunting effect of the tank on the bias resistors 12 and 13 will be greater and, hence, the transistor 1 will be conductive for a shorter period of time. This reduces the oscillator drive applied to emitter 24 through condenser 32 and resistor 33. On the other hand, if the mixer input signal falls in level, this effectively unloads the oscillator thereby increasing the Q and, by the reverse action, the oscillator drive power to the mixer is increased. In either event the instantaneous oscillator power applied across the base-emitter junction of transistor 21 is adjusted to provide correct instantaneous values for constant converter gain.

The loading or unloading of the tank circuit by the mixer tends to keep constant the sum of the two signals (the oscillator drive power plus the signal input) and this action is aided by the change in collector-base bias of transistor 21 produced by the change in operation of transistor 1. It will be noted that the collector-base bias of transistor 21 is supplied by resistor 14 in the oscillator-biasing circuit. It may be readily observed that the voltage across resistor 14 varies as the voltage across resistors 11, 12 and 13 varies. Since variation in voltage across resistors 11, 12 and 13 is dependent on the loading of tank circuit 6 by the mixer and on resultant oscillator drive, then variation in voltage across resistor 14 is dependent on oscillator operation for instantaneous values. For example, if the received radio frequency signal at the input terminal 25 is increased, the tank circuit 6 is more heavily loaded, and this reduces the effective impedance shunted across resistors 12 and 13. The voltage across the resistors 12 and 13 "floats" downward, thereby reducing the voltage across resistor 14. Since resistor 14 biases the collector and base electrodes of transistor 21, it follows that a decrease will result in the output of the mixer. Similarly, the decrease in radio frequency signal input at terminal 25 will produce an increase in the collector-base bias of transistor 21, and a resultant increased output.

Further, the diode 17 also tends to maintain a constant converter output. System parameters are established such that in the quiescent state, with voltages applied, a small regulating current will flow in diode 17; that is, it will function as a Zener diode to regulate the voltage across resistors 12 and 13. With capacitors 5 and 19 fully charged in the quiescent state, that is, with the full Zener voltage across resistors 12 and 13, the condensers will tend to augment this voltage across the resistors. As the voltage conditions are shifted on the diode 17 so that it is driven into the positive conductive region voltage-wise, it will draw current in the positive direction. This means that current will be allowed to flow from capacitor 19 and from capacitor 5 to support the biasing power on the transistor. For example, as the voltage on resistor 14 is decreased or increased due to changes in the voltage level of resistors 12 and 13, the conductivity of the diode 17 is varied. This means that the regulation of the voltage across the resistors 12 and 13, as affected by the condenser 19, will be varied. That is to say, when the voltage on resistor 14 is increased sufficiently to render the diode 17 conductive in a forward direction the condenser 19 will discharge through the diode 17, tending to maintain the voltage at the junction of the resistors 11 and 12 at an elevated level.

My oscillator-mixer circuit has at least the following outstanding features and advantages:

(1) The oscillator can operate only on the resonant mode of the crystal and not on the antiresonant mode, because of the very light feedback ratio (5% or less).

(2) The light loading of the oscillator tank permits a much higher operating Q in the oscillator tank circuit, thus increasing frequency stability.

(3) Peak power demands are supplied from the B+ supply rather than from the tank circuit, thus decreasing the loading on the tank due to the transistor circuit.

(4) The governor action of the resistor network and stretching circuit smoothes the operation of the oscillator, tending to produce a sine wave type of oscillation independent of the tank circuit.

(5) The combination of the oscillator and mixer tends to produce a constant conversion gain which is unaffected by signal input.

While I do not intend that this invention be limited to specific circuit values, the following parameters were used in a successful working embodiment of my invention and may be of aid to persons skilled in the art who wish to reproduce my invention:

| | |
|---|---|
| Transistor 1 | Type 2N128. |
| Transistor 21 | Type 2N128. |
| Crystal 10 | Resonant at 11.2 mc. (series mode). |
| Condenser 5 | .01 uf. |
| Condenser 7 | 36 uuf. |
| Resistor 11 | 3900 ohms. |
| Resistor 12 | 3900 ohms. |
| Resistor 13 | 4700 ohms. |
| Resistor 14 | 1000 ohms. |
| Condenser 15 | Stray capacitance across resistor 11 (about 5 uuf.). |
| Condenser 16 | .005 uf. |
| Diode 17 | Type IN469. |
| Resistor 18 | 4500 ohms. |
| Condenser 19 | .01 uf. |
| Condenser 27 | .0047 uf. |
| Condenser 29 | 39 uuf. |
| Condenser 32 | .0047 uf. |
| Resistor 33 | 4700 ohms. |
| Condenser 36 | 36 uuf. |

Having thus described a preferred form of my invention, many modifications and adaptations will become apparent to those skilled in the art. For example, NPN transistors can be substituted by means of appropriate circuit alterations, and point contact or other types of transistors may also be used. It is also clear that vacuum tubes may be suitable under appropriate circumstances, and that many other conventional mixer circuits may be employed in oscillator-mixer combinations. It is my intention, therefore, that my invention be limited only by the appended claims when read in the light of the prior art.

I claim:

1. In combination, an oscillator comprising: a transistor having base, emitter and collector electrodes, a frequency-determining network connected for alternating current between said collector and base electrodes, an alternating current feedback connection between a portion of said frequency-determining network and said emitter, a direct current biasing network for said transistor including first, second and third series-connected resistors connected between said emitter and said collector electrodes, said first and second resistors being connected in a closed series circuit with said emitter and base electrodes, said third resistor being connected in a closed series circuit with said frequency-determining network and said collector and base electrodes, a source of direct voltage connected across said second and third resistors, and a parallel-connected diode and a condenser connected across said second and third resistors.

2. The combination comprising: a mixer for mixing the output of an oscillator with a signal varying in amplitude and for deriving from the output of said mixer a voltage having a frequency which is the sum or difference of said oscillator frequency and said signal frequency, said mixer comprising an electronic translating device having an input circuit and an output circuit, said input circuit including means for injecting said oscillator output and said signal into said mixer, said oscillator comprising a transistor having base, emitter and collector electrodes, a frequency-determining network connected for alternating currents between said collector and said base electrodes, a normally low impedance connection from said frequency-determining network to said emitter electrode, a direct current biasing network for said oscillator and for said mixer including first, second, third and fourth series-connected resistors, said first and second resistors being connected in a closed series circuit with the emitter-base junction of said transistor, said third resistor being connected in a closed series circuit with said frequency-determining network and the collector-base junction of said transistor, said fourth resistor being connected in a closed series circuit with said direct current biasing network of said mixer, and a source of direct current potential connected across said second, third and fourth resistors.

3. The combination comprising: a mixer for mixing the output of an oscillator with a signal varying in amplitude and for deriving from the output of said mixer a voltage having a frequency which is the sum or difference of said oscillator frequency and said signal frequency, said mixer comprising an electronic translating device having an input circuit and an output circuit, said input circuit including means for injecting said oscillator output and said signal into said mixer, said oscillator comprising a transistor having base, emitter and collector electrodes, an oscillator frequency-determining network connected for alternating currents between said collector and said base electrodes, a normally low impedance connection from said frequency-determining network to said emitter electrode, a direct current biasing network for said oscillator and for said mixer including first, second, third and fourth series-connected resistors, said first and second resistors being connected in a closed series circuit with the emitter-base junction of said transistor, said third resistor connected in a closed series circuit with said frequency-determining network and the collector-base junction of said transistor, said fourth resistor being connected in a closed series circuit with said direct current biasing network of said mixer, a source of direct current potential connected across said second, third and fourth resistors, a condenser connected across said second, third and fourth resistors, and a diode connected across said second and third resistors.

References Cited in the file of this patent

UNITED STATES PATENTS

| | | |
|---|---|---|
| 2,556,286 | Meacham | June 12, 1951 |
| 2,825,813 | Sperling | Mar. 4, 1953 |
| 2,801,338 | Keller | July 30, 1957 |
| 2,841,703 | Bopp | July 1, 1958 |

FOREIGN PATENTS

| | | |
|---|---|---|
| 793,754 | Great Britain | Apr. 23, 1958 |